United States Patent
Kang et al.

(10) Patent No.: US 7,972,460 B2
(45) Date of Patent: Jul. 5, 2011

(54) METHOD OF MANUFACTURING PRINTED CIRCUIT BOARD

(75) Inventors: Myung-Sam Kang, Daejeon (KR); Jung-Hyun Park, Chungcheongnam (KR); Jeong-Woo Park, Suwon-si (KR); Ji-Eun Kim, Gwangmyeong-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 45 days.

(21) Appl. No.: 12/408,366

(22) Filed: Mar. 20, 2009

(65) Prior Publication Data
US 2010/0018633 A1    Jan. 28, 2010

(30) Foreign Application Priority Data
Jul. 22, 2008  (KR) .................. 10-2008-0071153

(51) Int. Cl.
*B32B 37/02*   (2006.01)
*H05K 1/02*    (2006.01)
*H01L 21/70*   (2006.01)

(52) U.S. Cl. ........ 156/253; 156/249; 156/252; 156/257; 156/268; 156/233; 156/237; 156/151; 156/240; 174/264; 438/653; 216/18

(58) Field of Classification Search ................ 156/233, 156/237, 257, 268, 151, 240, 249, 252, 253; 174/264; 29/852; 438/653; 216/18; 205/125
See application file for complete search history.

(56) References Cited

U.S. PATENT DOCUMENTS
2003/0143837 A1* 7/2003 Gandikota et al. ............ 438/629
2006/0191715 A1* 8/2006 Koyama et al. ................ 174/264
* cited by examiner

*Primary Examiner* — Linda L Gray
(74) *Attorney, Agent, or Firm* — McDermott Will & Emery LLP

(57) ABSTRACT

Disclosed is a method of manufacturing a printed circuit board. The method of manufacturing a printed circuit board having a via for connecting one layer to another layer can include forming a circuit pattern on one surface of a carrier; processing a hole corresponding to the via on one surface of the carrier; compressing the surface of the carrier into one surface of an insulation body; removing the carrier; processing a via hole on the insulation body, corresponding to a position of the hole; and forming a conductive material in the via hole, to thereby easily process a hole for forming a via and have high design freedom.

7 Claims, 33 Drawing Sheets

METHOD OF MANUFACTURING PRINTED CIRCUIT BOARD

CROSS-REFERENCE TO RELATED APPLICATIONS

This application claims the benefit of Korean Patent Application No. 10-2008-0071153, filed with the Korean Intellectual Property Office on Jul. 22, 2008, the disclosure of which is incorporated herein by reference in its entirety.

BACKGROUND

1. Technical Field

The present invention relates to a method of manufacturing a printed circuit board.

2. Description of the Related Art

With the development of the electronics industry, there has been a radically growing demand for smaller electronic parts with more advanced functions. Such a trend requires that circuit patterns are implemented in a printed circuit board in high density, and accordingly the method of forming micro circuit patterns is being developed and suggested in various ways.

For example, in case that a related structure in which a circuit pattern is formed on a surface of an insulation body is applied to a high density circuit (e.g. 20/20 um or less), various problems are generated. Accordingly, the structure in which a circuit pattern is buried in an insulation body has been suggested. For this structure, a circuit forming method has been developed. In particular, the circuit forming method is performed by forming a circuit pattern on a carrier and then by compressing the carrier into the insulation body to form the circuit pattern on the insulation body.

On the other hand, in accordance with the aforementioned related art, there are various problems. For example, in the operation of processing a via hole by using a laser drill to form a via for connecting a layer to another layer, using energy excessively makes it impossible to form the via hole with a desired shape. These problems are regarded as hindrance to realizing the structural benefits, which were expected to be implemented through the structure of a circuit pattern buried in an insulation body.

SUMMARY

The present invention provides a method of manufacturing a printed circuit board that can easily process a hole for forming a via and have high design freedom.

An aspect of the invention features a method of manufacturing a printed circuit board having a via for electronically connecting one layer to another layer, including forming a circuit pattern on one surface of a carrier; processing a hole on one surface of the carrier, the hole corresponding to the via; compressing the surface of the carrier to one surface of an insulation body; removing the carrier; processing a via hole in the insulation body, the position of the via hole corresponding to the position of the hole; and forming a conductive material inside the via hole.

The forming of the circuit pattern can include forming a barrier on one surface of the carrier; and forming the circuit pattern on the barrier.

At this time, the forming of the conductive material inside the via hole can include forming a second seed layer on an inner wall of the via hole and on a surface of the barrier; forming a conductive material inside the via hole and on the barrier through electroplating; and removing the conductive material formed on the barrier.

Prior to the compressing of the surface of the carrier to one surface of the insulation body, the method can further include removing a part of the first seed layer. The hole can be formed in such a way that the hole penetrates through the first seed layer and the barrier.

The circuit pattern can include a via land; and the hole can be formed in such a way that the hole penetrates through a center of the via land. The forming of the conductive material can be performed such that the inside of the via hole is filled.

DETAIL DESCRIPTION

Figure 1:
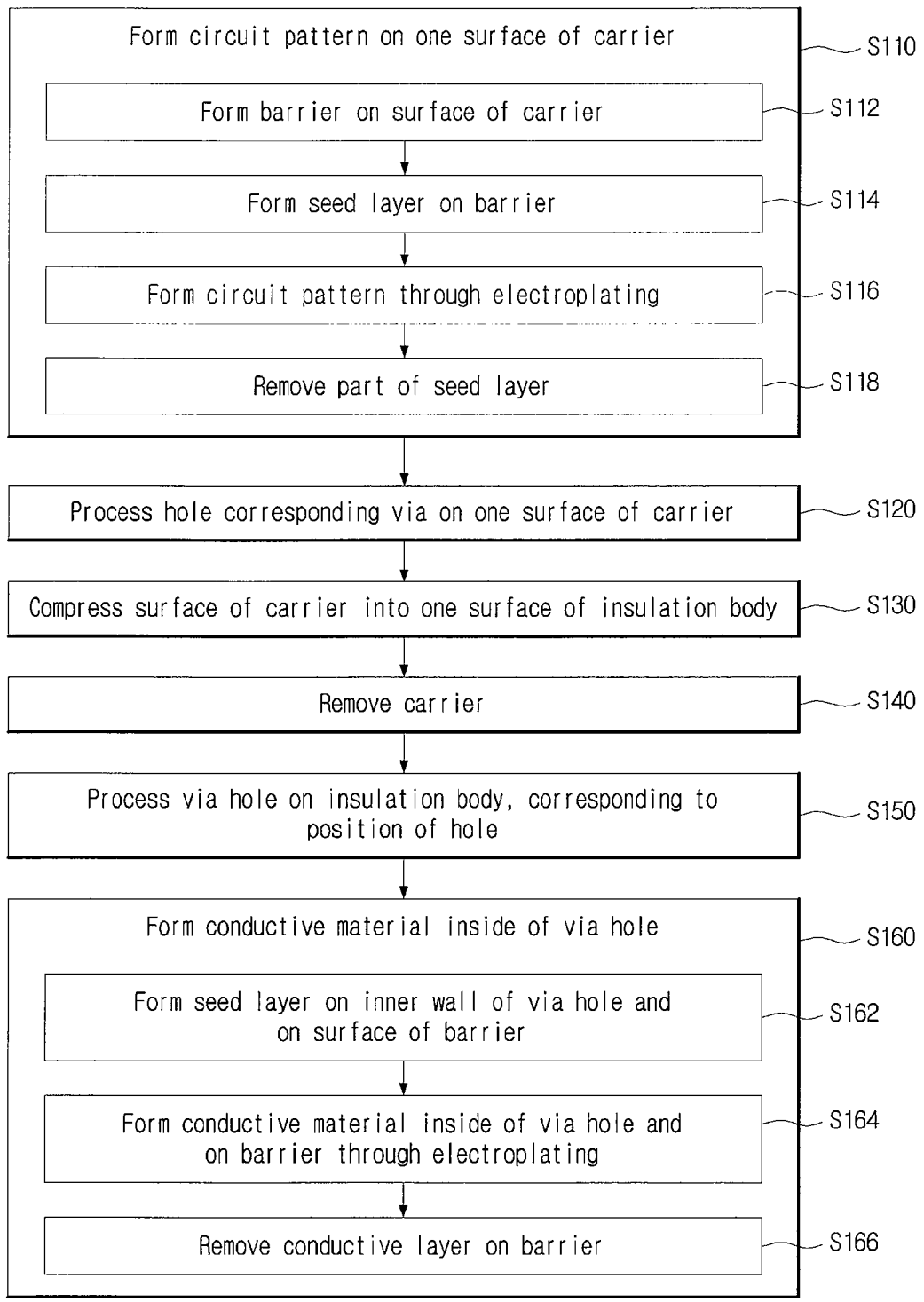
FIG. 1 is a flowchart showing a method of manufacturing a printed circuit board in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, some embodiments of a method of manufacturing a printed circuit board in accordance with the present invention will be described in detail with reference to the accompanying drawings. Identical or corresponding elements will be given the same reference numerals, regardless of the figure number, and any redundant description of the identical or corresponding elements will not be repeated.

FIG. 1 is a flowchart showing a method of manufacturing a printed circuit board in accordance with an embodiment of the present invention, and FIG. 2 through FIG. 17 show each process of a method of manufacturing a printed circuit board in accordance with an embodiment of the present invention. In FIG. 2 through FIG. 17, there shown are carriers 10a and 10b, barriers 12a and 12b, seed layers 14a and 14b, plating resists 16a and 16b, circuit patterns 18a and 18b, an adhesive layer 20, a hole 30, an inner layer 40, an inner circuit 42, an insulation body 50, a via hole 54, other seed layers 56 and 58, conductive material 62 and 64, and a solder resist 70.

Firstly, the circuit pattern 18a can be formed on one surface of the carrier 10a in a process represented by S110. The circuit pattern 18a formed on one surface of the carrier 10a is to move and be buried in the insulation body 50 later through the carrier 10a. Below described briefly is the method of forming the circuit pattern 18a on the carrier 10a.

Figure 2:
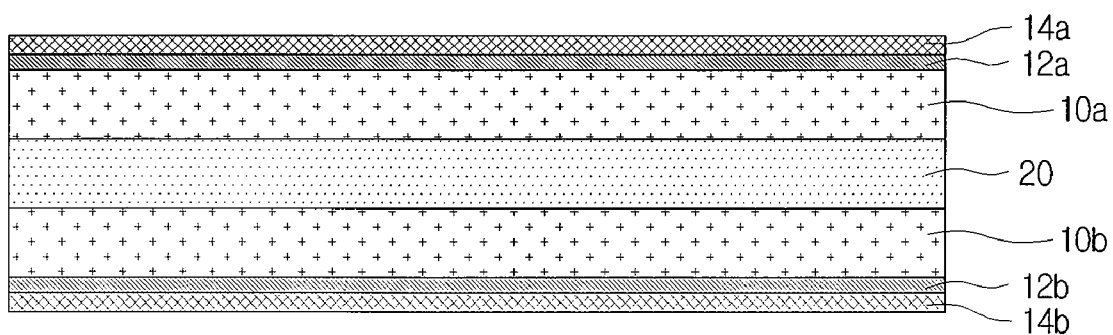
FIG. 2 through FIG. 17 show each process of a method of manufacturing a printed circuit board in accordance with an embodiment of the present invention.

Firstly, as shown in FIG. 2, the two carriers 10a and 10b can be adhered to each other by using the adhesive layer 20, and then the barriers 12a and 12b can be formed on one surface of the carrier 10a and one surface of the carrier 10b, respectively, in a process represented by S112. The barriers 12a and 12b can be formed on the carriers 10a and 10b by using a plating method or by compressing a film-type material into the carriers 10a and 10b.

The barriers 12a and 12b can be made of a material that is different from those of the carriers 10a and 10b. In particular, the barriers 12a and 12b can be made of a material that has no reaction with an etchant, reacted with the carriers 10a and 10b. For example, when the carriers 10a and 10b are made of copper, the barriers 12a and 12b can be made of nickel, chrome, and aluminum. This can allow the barriers 12a and 12b to function as an etch-stop.

Then, as shown in FIG. 2, the seed layers 14a and 14b can be formed on the barriers 12a and 12b, respectively, in a process represented by S114. Electroless copper plating, for example, can be used to form the seed layers 14a and 14b.

Figure 3:
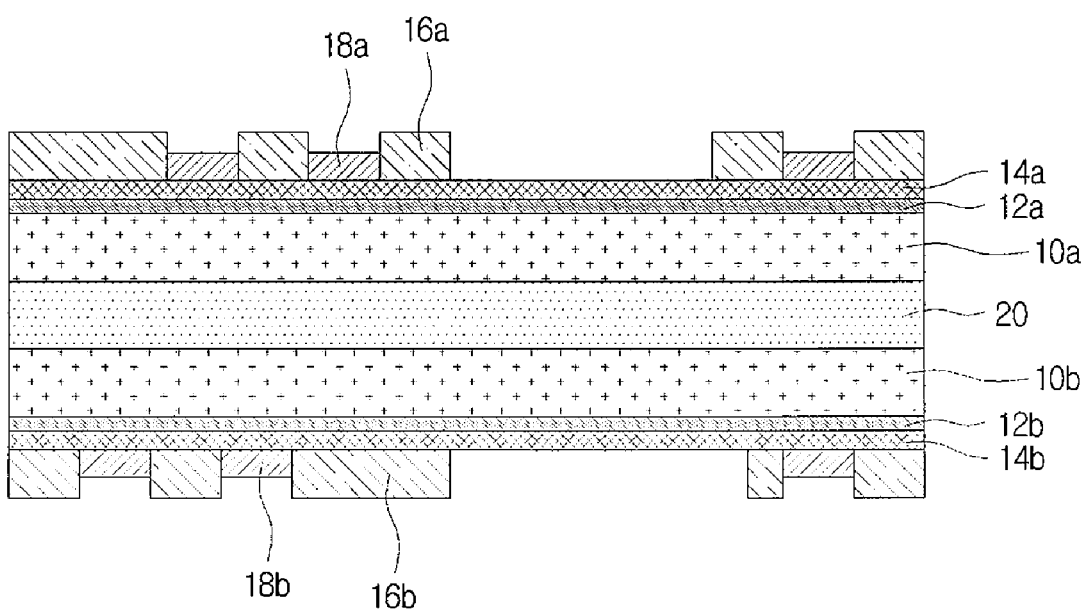

Thereafter, as shown in FIG. 3, the circuit patterns can be formed by performing an electroplating operation using the plating resists 16a and 16b in a process represented by S116 and performing a flash etching in a process represented by S118.

Although the electroplating operation is performed after the seed layers 14a and 14b are formed on the barriers 12a and 12b in accordance with an embodiment of the present invention, the circuit patterns 18a and 18b can be formed by performing the electroplating on the barriers 12a and 12b without the prior operation of forming the seed layers 14a and 14b, according to design or processing conditions.

Figure 4:
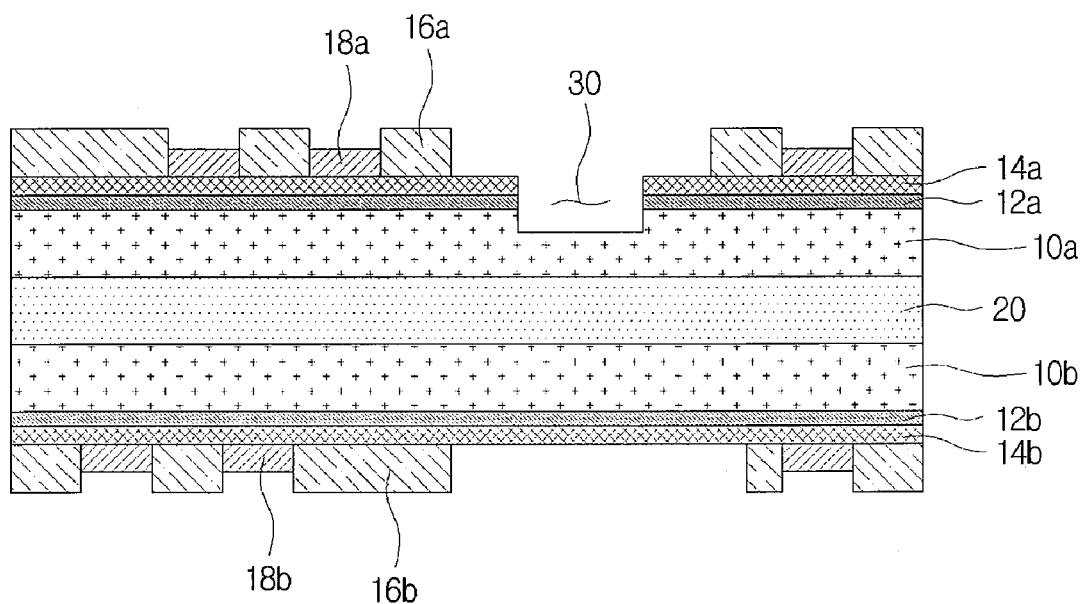

As such, the circuit patterns 18a and 18b can be formed. Thereafter, as shown in FIG. 4, the hole 30 corresponding to a via can be processed on one surface of the carrier 10a in a process represented by S120. In other words, the hole 30 can be processed at an area in which the via is to be formed later. A $CO_2$ laser or a YAG laser can be used to process the hole 30.

At this time, the hole 30 can be formed in such a way that the hole 30 penetrates through the seed layer 14a and the barrier 12a. This will be described in detail later.

Figure 5:
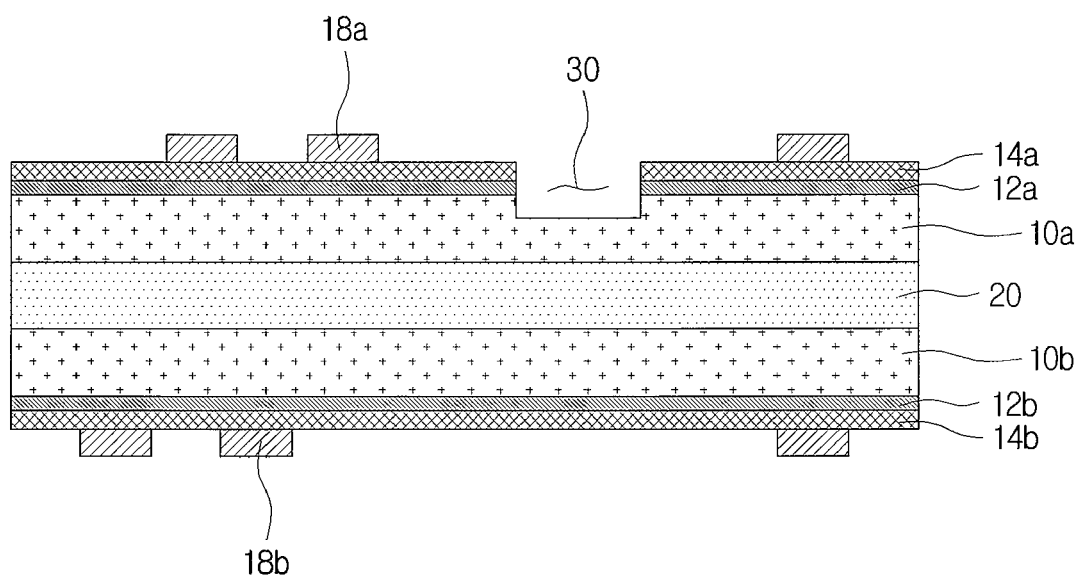
Figure 6:
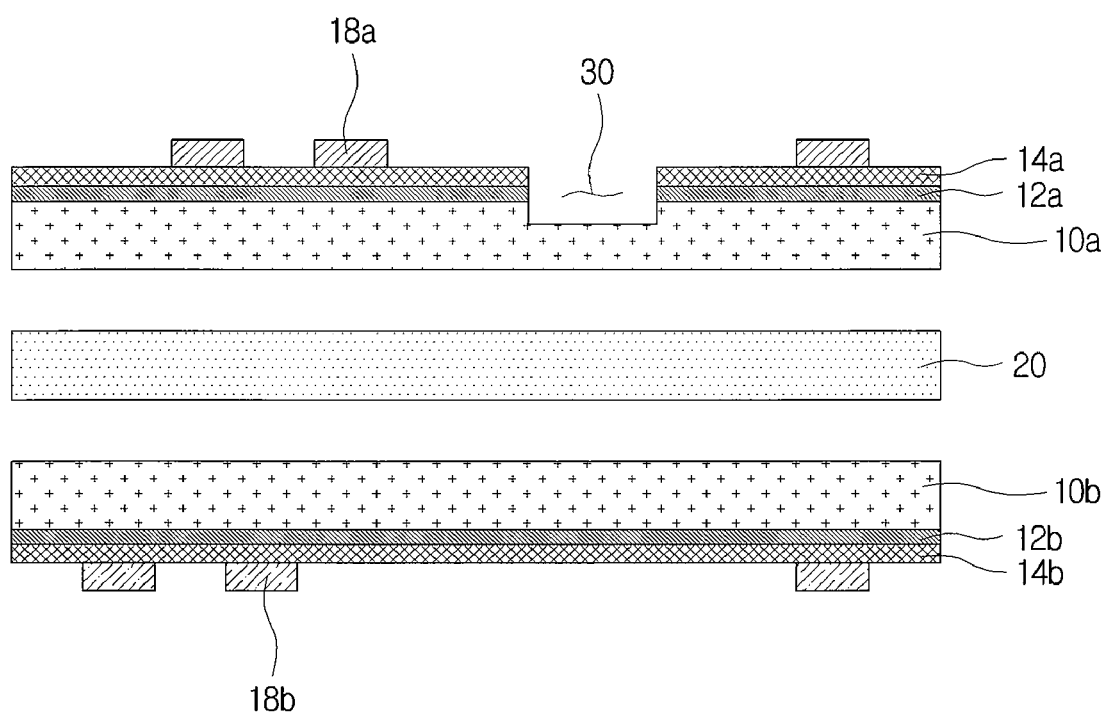

As such, the hole 30 can be processed. Thereafter, the plating resists 16a and 16b can be removed as shown in FIG. 5, and the carriers 10a and 10b can be separated from the adhesive layer 20. This can make it possible to manufacture two carriers 10a and 10b having each surface formed with the circuit patterns 18a and 18b, respectively.

Figure 7:
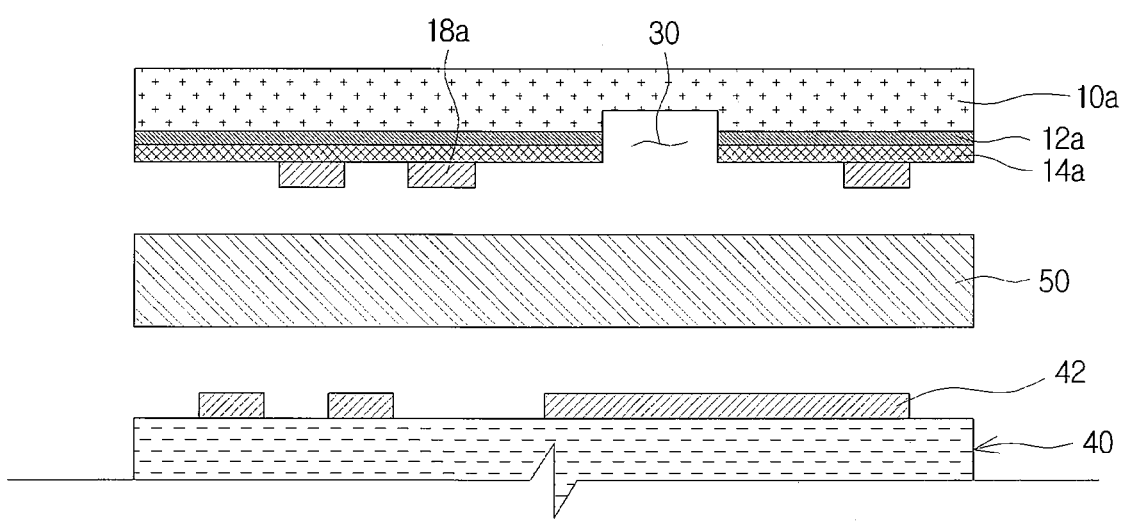

Then, as shown in FIG. 7, the surface of carrier 10a on which the hole 30 is processed can be compressed into one surface of the insulation body 50 in a process represented by S130. At this time, in the case of attempting manufacture a multi-layered board, the inner layer 40 can be stacked in a direction of the other direction of the insulation body 50, or on the opposite side of the surface into which the carrier 10a is compressed. Even through the carrier 10a, the insulation body 50, and the inner layer 40, as shown in FIG. 7, can be collectively stacked together, it can be alternatively possible that the insulation body 50 can be stacked on the inner layer 40, and then the carrier 10a can be successively stacked on the insulation body 50.

Figure 8:
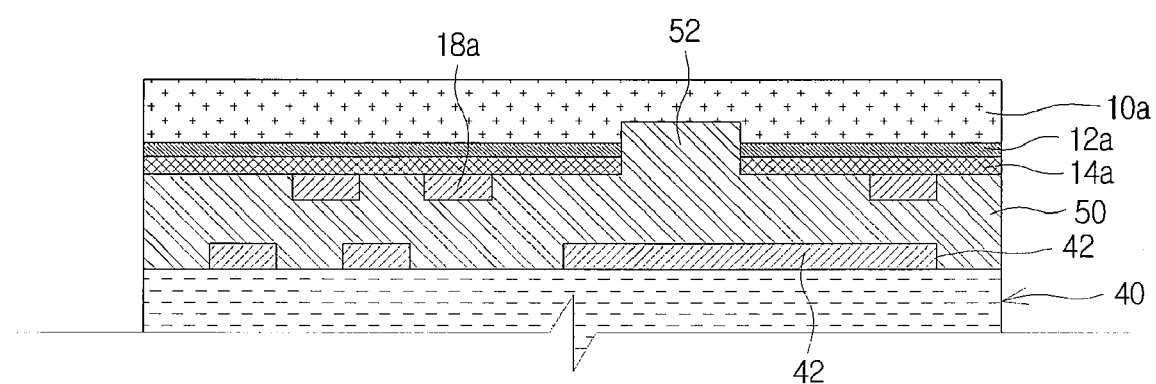
Figure 9:
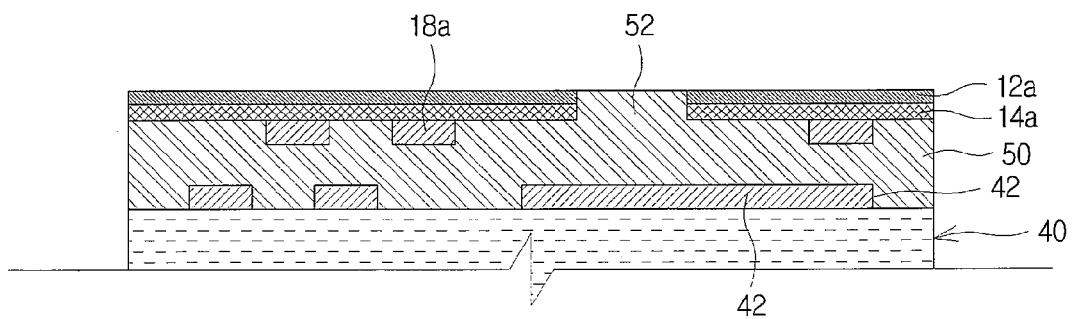
Figure 10:
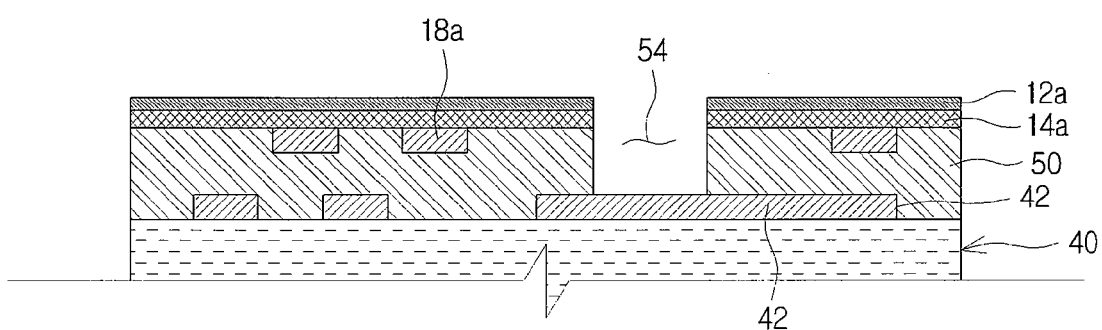

As such, if the carrier 10a is compressed into the insulation body 50, as shown in FIG. 8, an insulation body 52 placed at an area in which the hole 30 (refer to FIG. 7) has been processed can have a protruding shape. Later, the carrier 10a can be removed in a process represented by S140. If the carrier 10a is removed, as shown in FIG. 9, the insulation body 52 placed at the area in which the hole 30 has been formed can be exposed.

Although a mechanical polishing method can be used to remove the carrier 10a, a chemical method using an etchant can be suggested in accordance with an embodiment of the present invention. When the barrier 12a made of nickel or chrome is placed below the carrier 10a made of copper, the etching is performed on the carrier 10a by using an etchant that is reacted with copper only, the etchant has no effect on the barrier 12a. Accordingly, the barrier 12a can function as an etch-stop, to thereby control an etched depth more efficiently.

After the carrier 10a is removed, as shown in FIG. 10a, the via hole 54 can be processed, corresponding to the position of the hole 30 (refer to FIG. 7), on the insulation body 50. The above processes can provide a selectively exposed area of the insulation body 50. Accordingly, the via hole 54 can be formed by processing the exposed area.

The $CO_2$ laser or the YAG laser can be used to process the via hole 54. In case that the hole 30 of the carrier 10a is formed to penetrate the barrier 12a as described above, no additional metal layer, which is the barrier 10a or the seed layer is formed at an area in which the via hole 54 is to be formed. Accordingly, when a laser drill is used to process the via hole 54, it can require small energy to form via hole 54. This can result in having a beneficial effect to form a shape of the via hole 54.

As such, the via hole 54 can be formed. Thereafter, the conductive material 62 and 64 can be formed in the via hole 54 in a process represented by S160. This will be described below in more detail.

Figure 11:
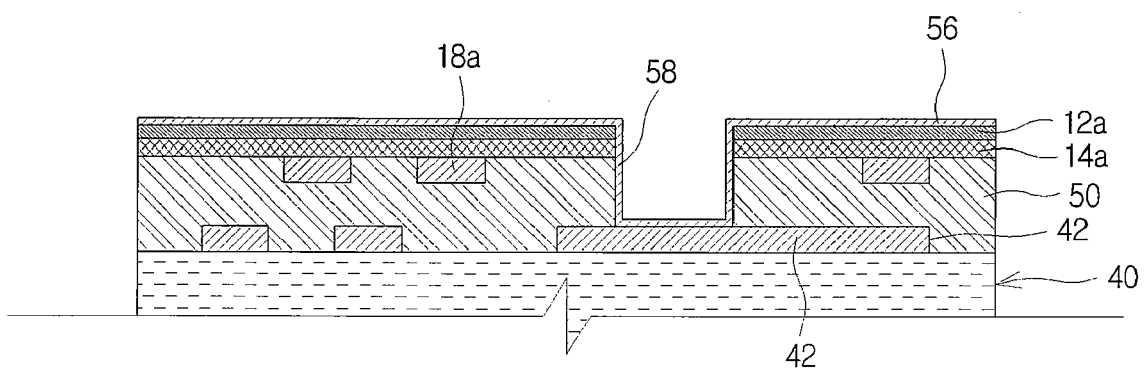

Firstly, as shown in FIG. 11, the seed layers 56 and 58 can be formed on an inner wall of the via hole 54 and a surface of the barrier 12a, respectively, in a process represented by S162. Electroless copper plating can be used to form the seed layers 56 and 58.

Figure 12:
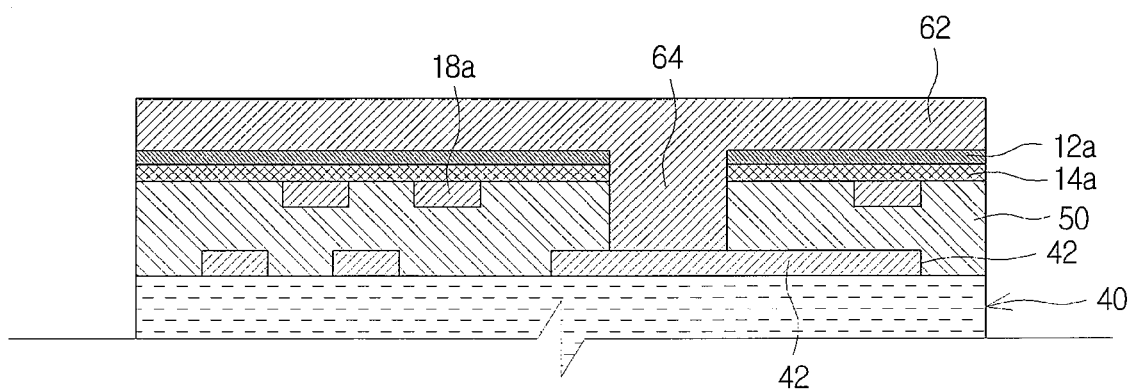

After the seed layers 56 and 58 are formed, as shown in FIG. 12, the conductive material 62 and 64 can be formed in the via hole 54 and on the barrier 12a through the electroplating in a process represented by S164. Such a process can be performed to allow the conductive material 62 and 64 such as copper to be filled in the via hole 54. In other words, the electroplating can be performed until the conductive material 62 and 64 is completely filled in the via hole 54.

The conductive material 62 and 64 to be formed in the via hole 54 will function as vias for electrically connecting one layer to another layer later. Accordingly, filling the conductive material 62 and 64 in the previously formed via hole 54 can make form a structure that is beneficial in order to acquire reliability in electrically connecting one layer to another layer later.

Figure 13:
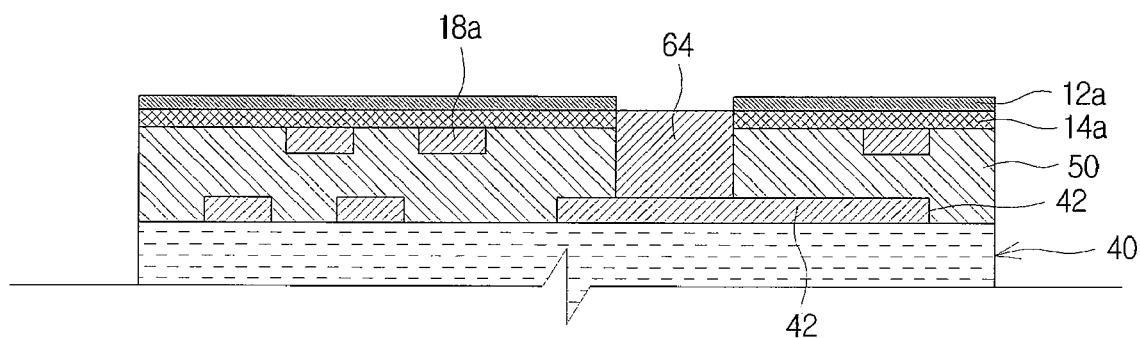

Thereafter, as shown FIG. 13, the conductive material 62 formed on the barrier 12a can be removed in a process represented by S166. In accordance with an embodiment of the present invention, the chemical method using an etchant can be used to remove the conductive material 62 formed on the barrier 12a. When the barrier 12a made of nickel or chrome is placed below the conductive material 64 made of copper, the etching is performed on the conductive material 62 by using an etchant that is reacted with copper only, the etchant has no effect on the barrier 12a. Accordingly, the barrier 12a can function as an etch-stop, to thereby control an etched depth more efficiently.

Figure 14:
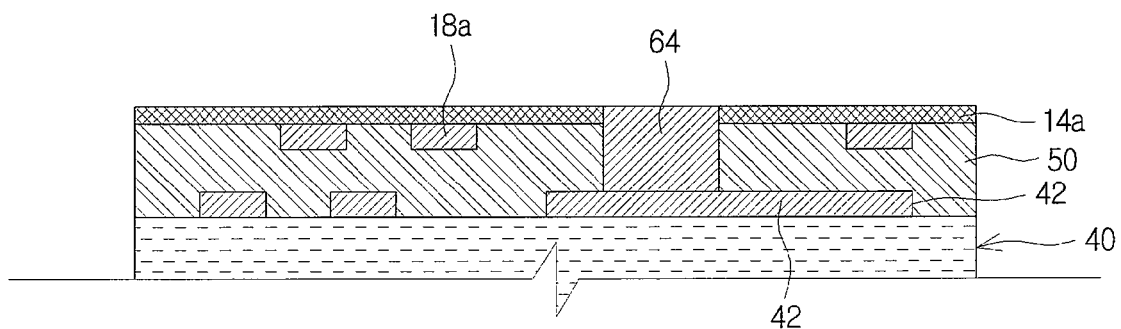

Then, as shown in FIG. 14, the barrier 12a can be removed. The chemical method using an etchant can be used to remove the barrier 12a. Since the barrier 12a and the seed layer 14a placed below the barrier 12a have different reactions with each other for the etchant, this can have no effect on the seed layer 14a and remove the only barrier 12a efficiently.

Figure 15:
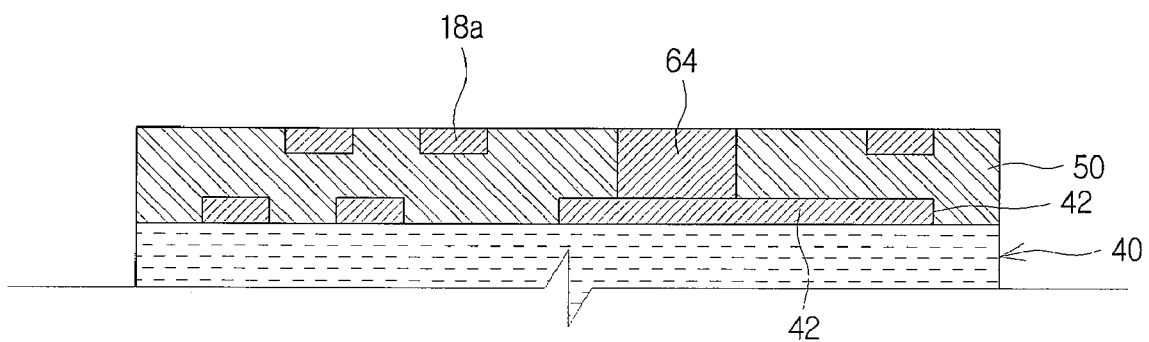
Figure 16:
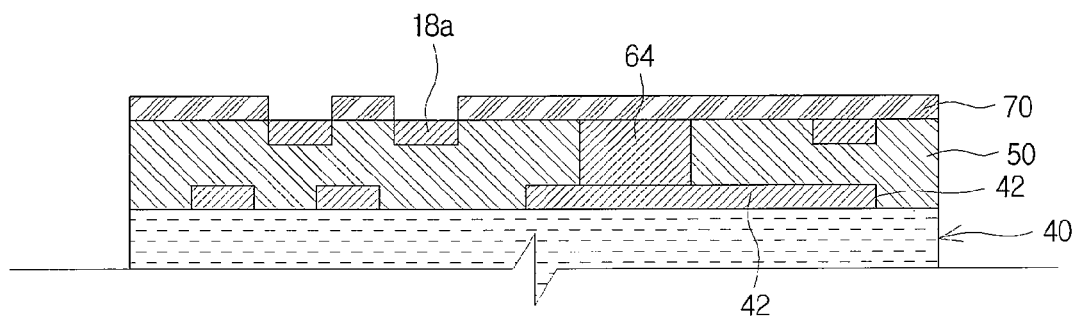

Thereafter, as shown in FIG. 15, the seed layer 14a can be removed through a flash etching. Then, as shown in FIG. 16, the solder resist 70 can be formed at a top layer. In the case of attempting to form a multi-layered structure, another insulation body can be formed on the insulation body 50 instead of forming the solder resist 70.

Figure 17:
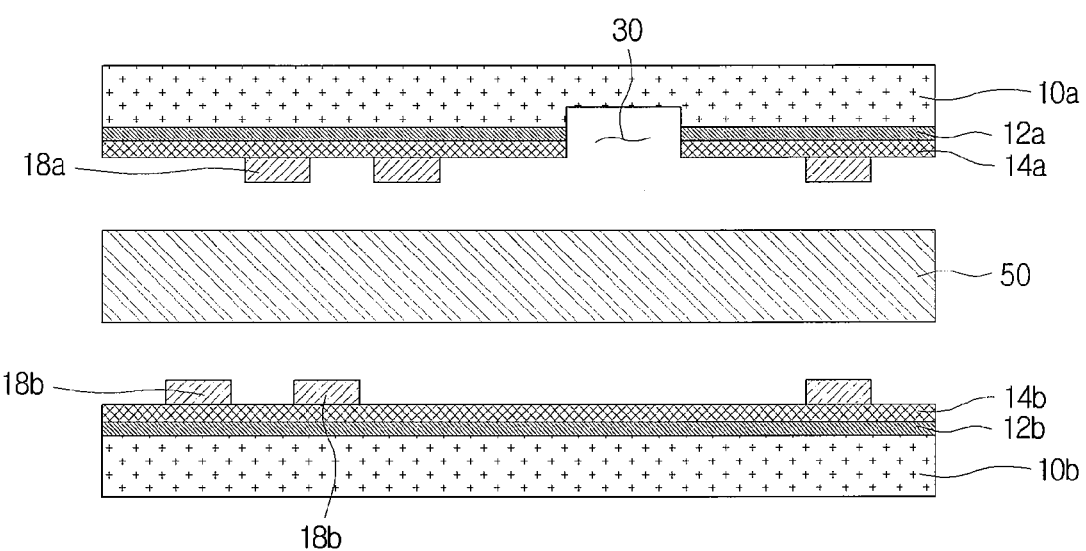

Although the above processes show that the inner layer 40 is placed below the insulation body 50, as shown in FIG. 17, a two-layered printed circuit board can be formed by stacking the carrier 10b formed with a predetermined circuit pattern 18b below the insulation body 50. At this time, the carrier 10b to be stacked below the insulation body 50 can be manufactured through the processes described with reference to FIG. 2 through FIG. 6.

Figure 18:
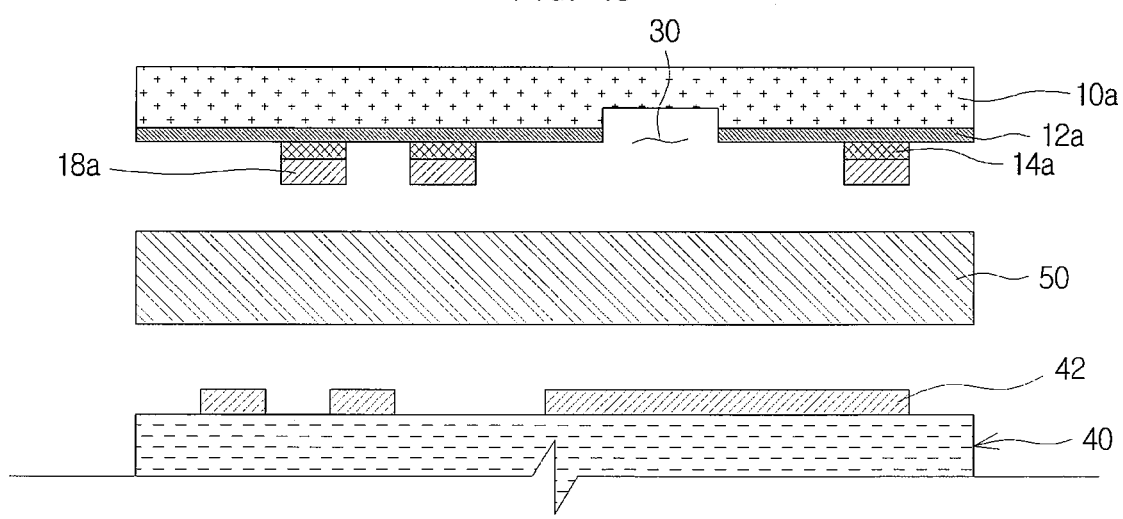
FIG. 18 through FIG. 20 show each process of a method of manufacturing a printed circuit board in accordance with another embodiment of the present invention.
Figure 19:
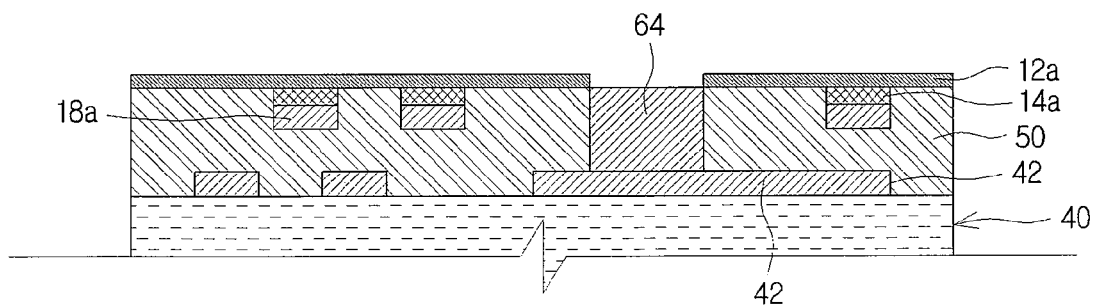
Figure 20:
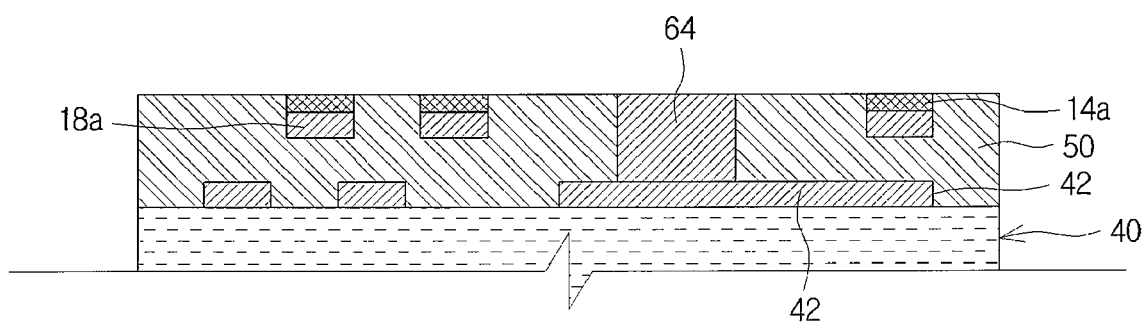

Hereinafter, a method of manufacturing a printed circuit board in accordance with another embodiment of the present invention will be described with reference to FIG. 18 through FIG. 20. FIG. 18 through FIG. 20 shows each process of a method of manufacturing a printed circuit board in accordance with another embodiment of the present invention. In FIG. 18 through FIG. 20, there shown are a carrier 10a, a barrier 12a, a seed layer 14a, a circuit pattern 18a, a hole 30, an inner layer 40, an inner circuit 42, an insulation body 50, and a conductive material 64.

As compared with the aforementioned embodiment of the present invention, the method of manufacturing a printed circuit board in accordance with another embodiment of the present invention futures some differences that the seed layer 14a can be firstly removed through a flash etching, for example, before the carrier 10a formed with the circuit pattern 18a is compressed into the insulation body 50.

In particular, as shown in FIG. 18, a part of the seed layer 14a can be firstly removed through the flash etching, and the carrier 10a can be compressed into the insulation body 50. Then, the carrier 10a can be removed. Thereafter, a via hole (refer to the reference numeral 54 of FIG. 10) can be processed on the insulation part 50 by using a laser drill, for example, and the conductive material 64 can be filled in the via hole (refer to the reference numeral 54 of FIG. 10). Accordingly, a via for electrically connecting one layer to another layer can be formed. FIG. 19 shows that the via is formed through the above processes.

Thereafter, the printed circuit board in which the circuit pattern 18a is buried can be manufactured by removing the barrier 12a.

Hereinafter, a method of manufacturing a printed circuit board in accordance yet another embodiment of the present invention will be described with reference to FIG. 21 through FIG. 33. In FIG. 21 through FIG. 33, there shown are carriers 10a and 10b, barriers 12a and 12b, seed layers 14a and 14b, plating resists 16a and 16b, circuit patterns 18a and 18b, a via land 19, an adhesive layer 20, a hole 30, an inner layer 40, an inner circuit 42, an insulation body 50, a via hole 54, other seed layers 56 and 58, conductive material 62 and 64, and a solder resist 70.

The method of manufacturing a printed circuit board in accordance with yet another embodiment of the present invention features some differences that a via land can be formed as compared with the aforementioned embodiments of the present invention.

Figure 21:
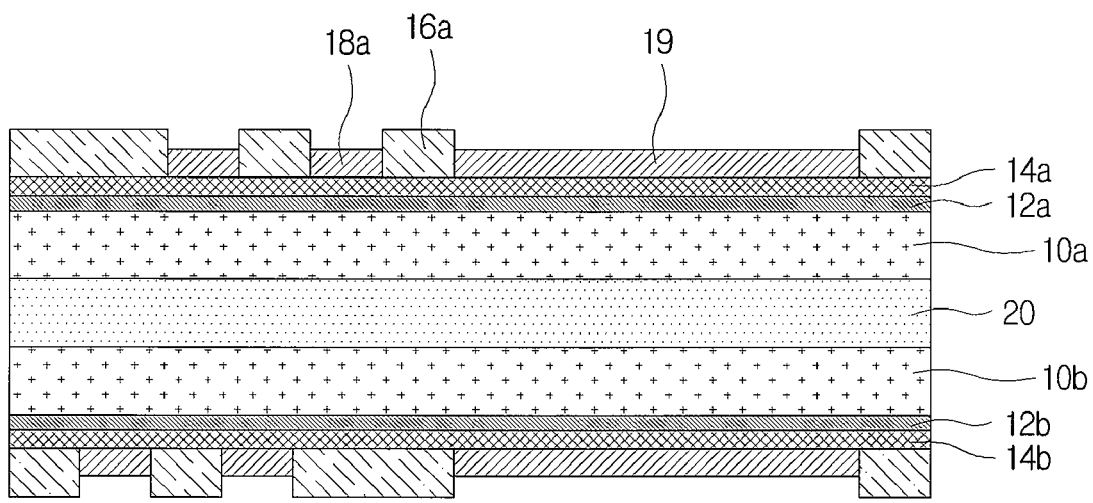
FIG. 21 through FIG. 33 show each process of a method of manufacturing a printed circuit board in accordance with yet another embodiment of the present invention.
Figure 22:
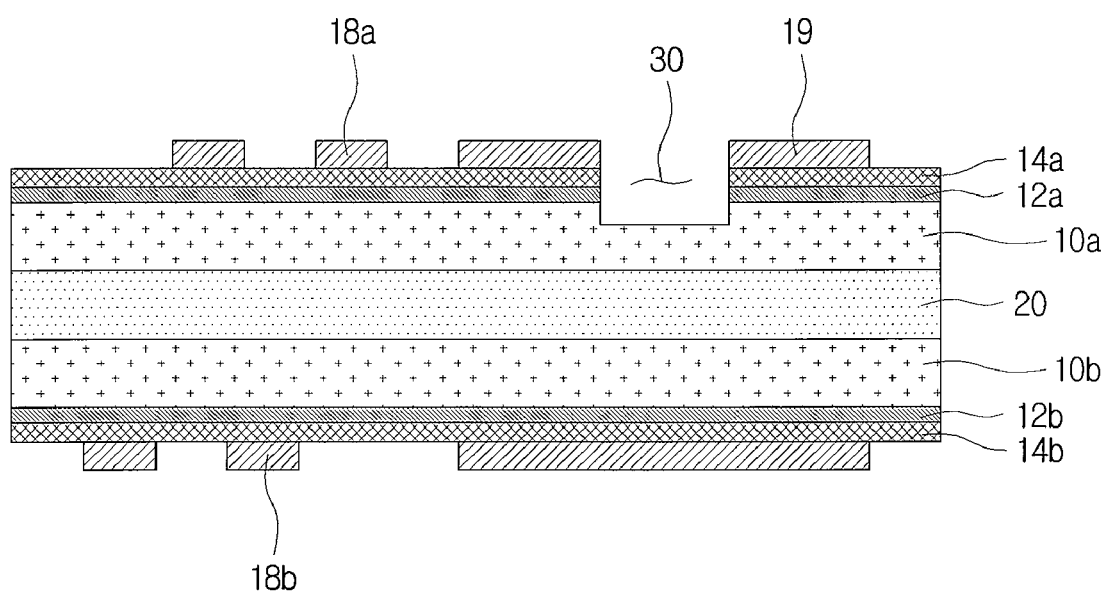

In other words, in the case of attempting to more efficiently acquire reliability of a via to form the via land 19, as shown in FIG. 21, when the circuit pattern 18a is formed on the carrier 10a, the via land 19 can be also formed. Then, as shown in FIG. 22, the hole 30 can be formed to penetrate a center of the via land 19.

The via land 19 can be formed at an area in which a via is to be formed later on the carrier 10a. The hole 30 penetrating the via land 19 can be processed by using a $CO_2$ laser 또는a YAG laser.

As described above, the hole 30 can be formed to penetrate the barrier 12a.

Figure 23:
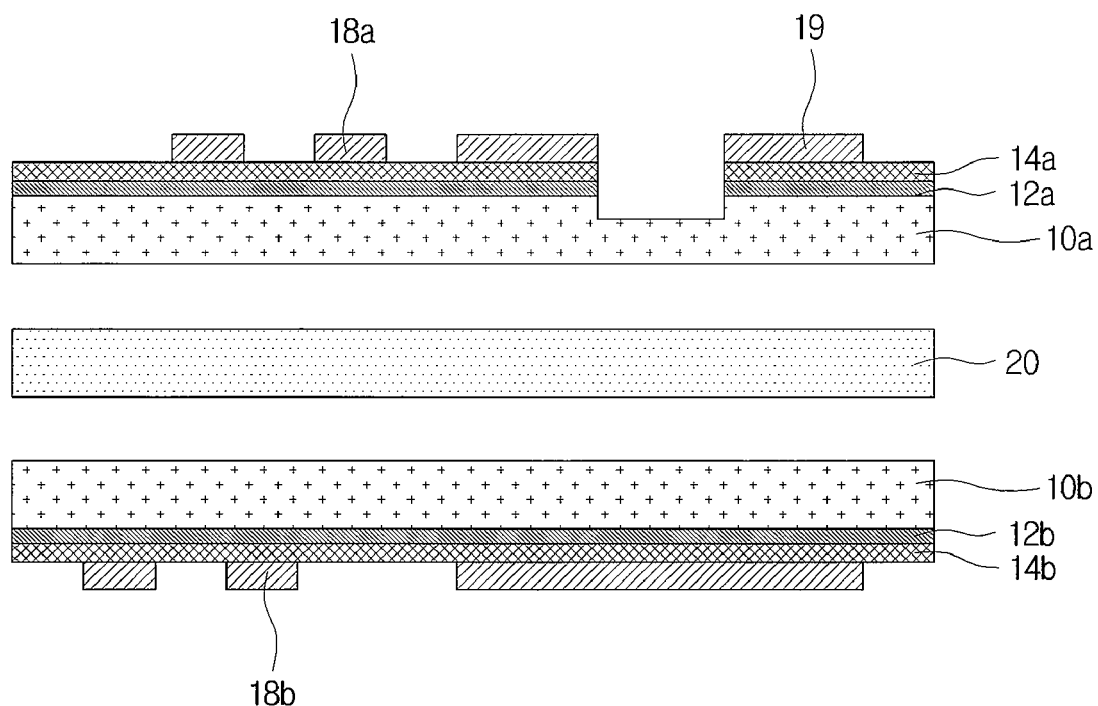

As such, the hole 30 can be processed. Thereafter, as shown in FIG. 23, the carriers 10a and 10b can be separated from the adhesive layer 20. This can make it possible to manufacture two carriers 10a and 10b having each surface formed with the circuit patterns 18a and 18b, respectively.

Figure 24:
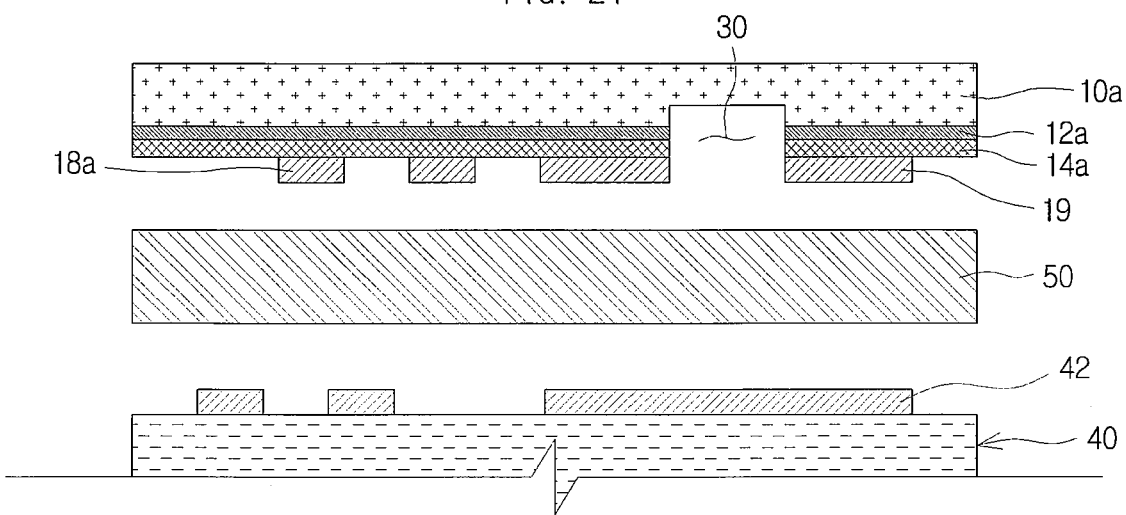
Figure 25:
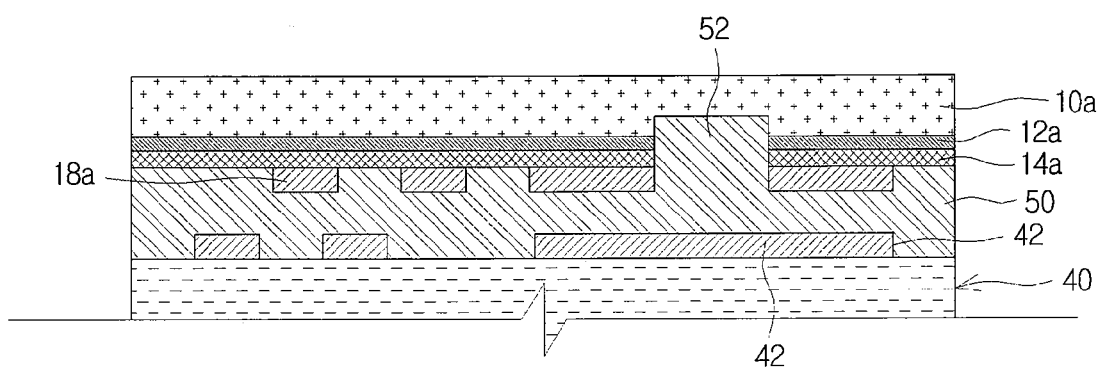
Figure 26:
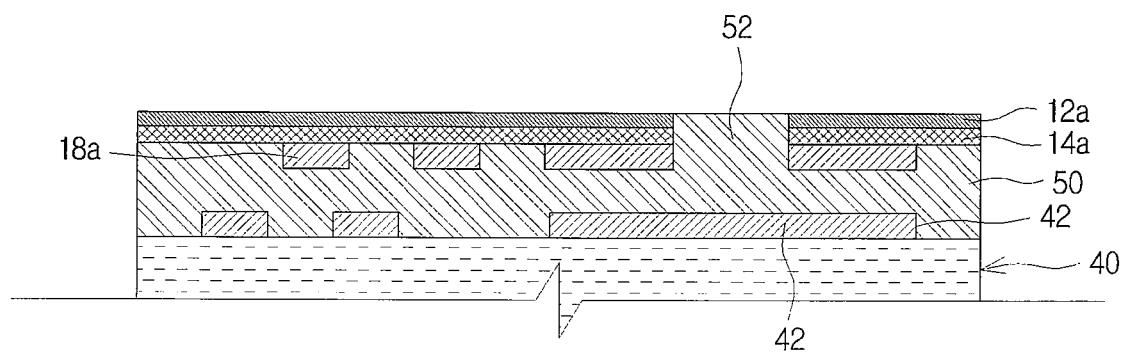

Then, as shown in FIG. 24 and FIG. 25, the surface of carrier 10a on which the hole 30 is formed can be compressed into one surface of the insulation body 50. Thereafter, if the carrier 10a is removed, as shown in FIG. 26, the insulation body 52 placed at the area in which the hole 30 has been formed can be exposed.

Figure 27:
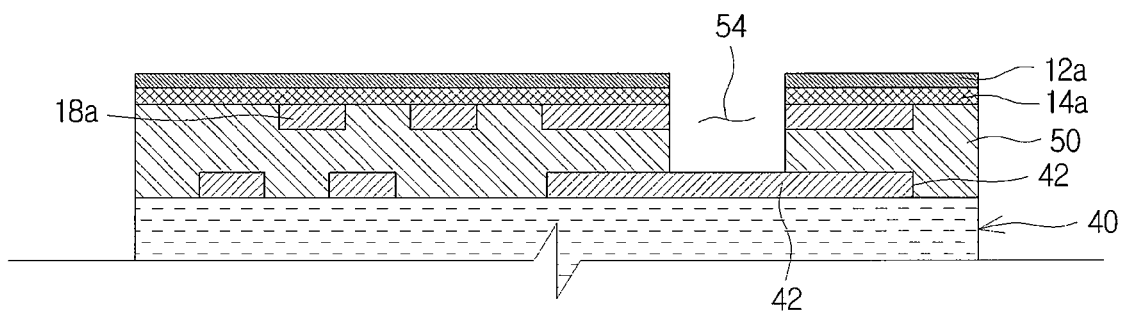

Then, as shown in FIG. 27, the via hole 54 can be processed through the exposed insulation body 52. The $CO_2$ laser or the YAG laser can be used to process the via hole 54. In accordance with yet another embodiment of the present invention, no metal layer is formed at an area in which the via hole 54 is to be formed. Accordingly, when a laser drill is used to process the via hole 54, it can require small energy to form via hole 54. This can result in having a beneficial effect to form a shape of the via hole 54.

Figure 28:
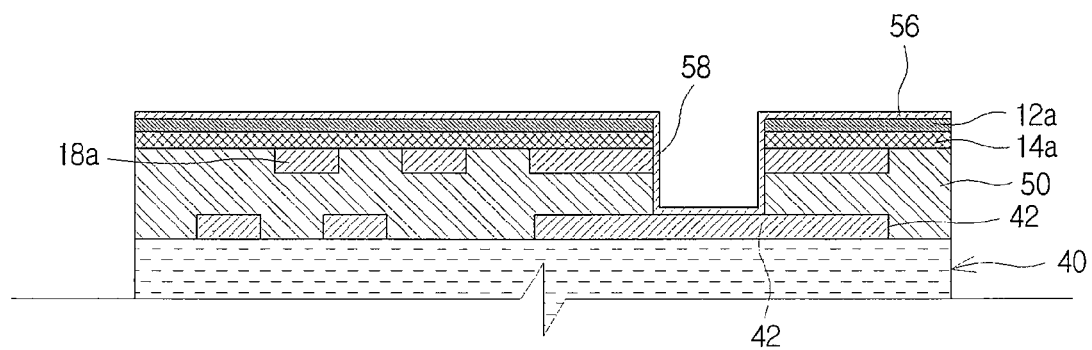
Figure 29:
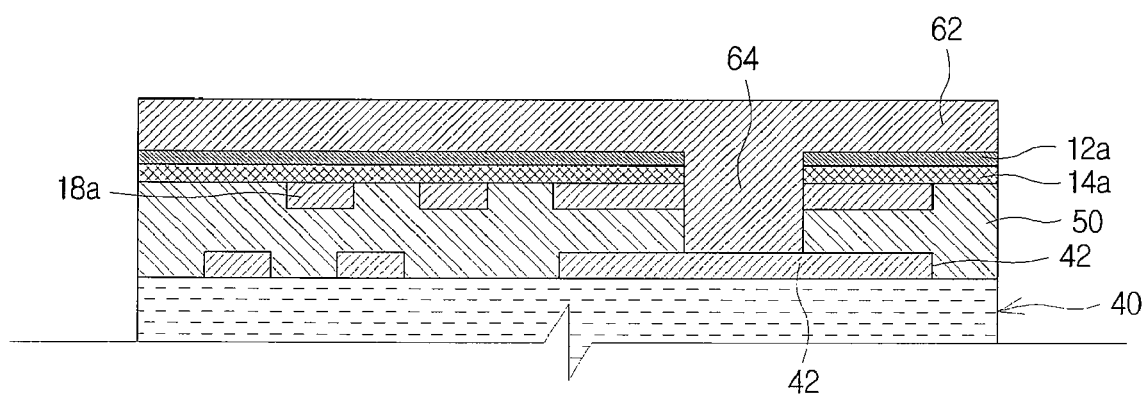
Figure 30:
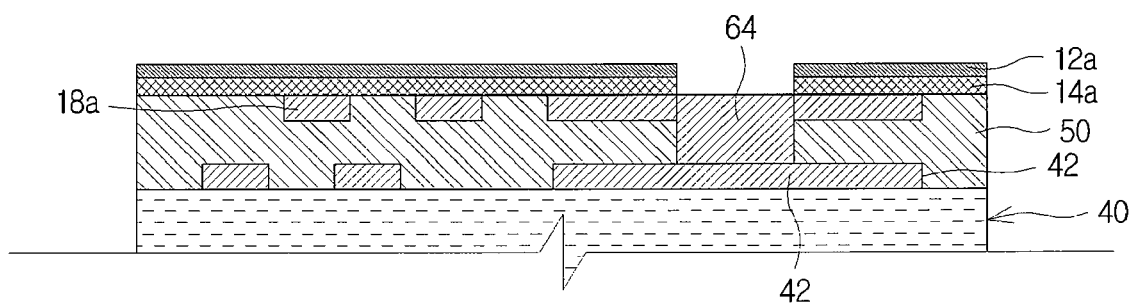

As such, the via hole 54 can be formed. Thereafter, the conductive material 62 and 64 can be formed inside the via hole 54 through the processes shown in FIG. 28 through FIG. 30. In particular, as shown in FIG. 28, the seed layers 56 and 58 are formed. Then, as shown in FIG. 29, the conductive material 62 and 64 can be formed on the inside of the via hole 54 and the barrier 12a through the electroplating. Thereafter, as shown FIG. 30, the conductive material 62 formed on the barrier 12a can be removed.

The chemical method using an etchant can be used to remove the conductive material 62 formed on the barrier 12a. When the barrier 12a made of nickel or chrome is placed below the conductive material 62 made of copper, the etching is performed on the conductive material 62 by using an etchant that is reacted with copper only, the etchant has no effect on the barrier 12a. Accordingly, the barrier 12a can function as an etch-stop, to thereby control an etched depth more efficiently.

Figure 31:
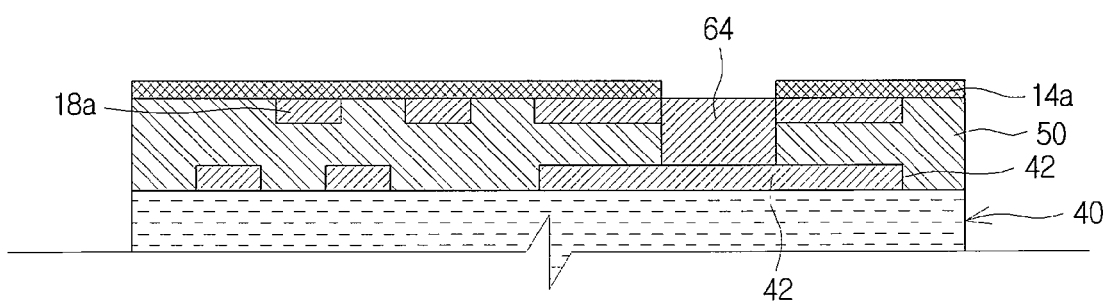
Figure 32:
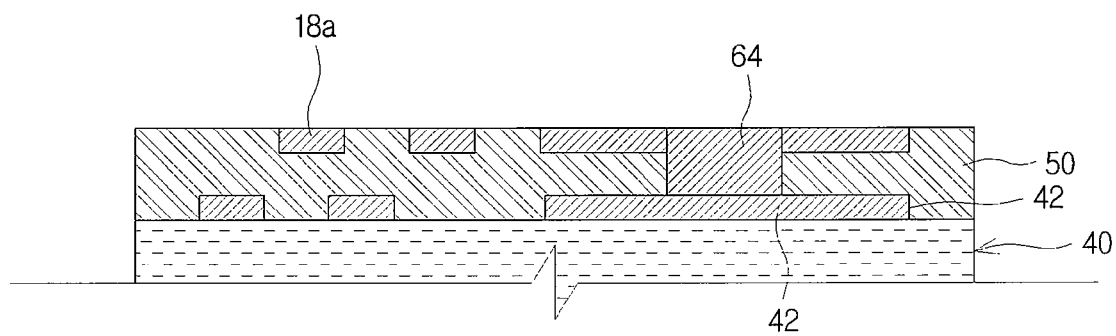
Figure 33:
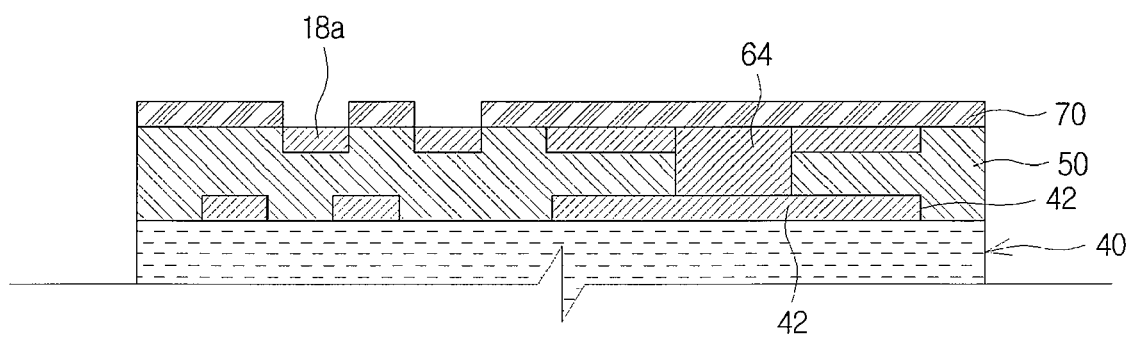

Then, as shown in FIG. 31, the barrier 12a can be removed. Thereafter, as shown in FIG. 32, the seed layer 56 and 58 can be removed through a flash etching. Then, as shown in FIG. 33, the solder resist 70 can be formed at a top layer.

Although the above processes show that the inner layer 40 is placed below the insulation body 50, as shown in FIG. 17, a two-layered printed circuit board can be formed by stacking the carrier 10b formed with a predetermined circuit pattern 18b below the insulation body 50 as described above.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

Many embodiments other than those set forth above can be found in the appended claims

What is claimed is:

1. A method of manufacturing a printed circuit board having a via for electronically connecting one layer to another layer, the method comprising:
    forming a barrier on one surface of a carrier;
    forming a circuit pattern on the barrier;
    processing a hole corresponding to a via in the carrier from the barrier toward the carrier, the hole penetrating the barrier;
    pressing the surface of the carrier to one surface of an insulation body after processing the hole such that the hole formed in the carrier is filled with a portion of the insulation body, and the circuit pattern is buried in the insulation body;
    removing the carrier such that the portion of the insulation body filled in the hole is exposed;
    forming a via hole by processing the exposed portion of the insulation body such that the via hole penetrates the insulation body; and
    forming a conductive material inside the via hole such that the via is formed.

2. The method of claim 1, further comprising forming a first seed layer on the barrier, the first seed layer being a different material of the barrier, wherein the circuit pattern is formed on the first seed layer through electroplating.

3. The method of claim 1, wherein the forming of the conductive material inside the via hole comprises:
    forming a second seed layer on an inner wall of the via hole and on a surface of the barrier;
    carrying out an electroplating operation such that the conductive material is formed inside the via hole and on the barrier; and
    removing the conductive material formed on the barrier.

4. The method of claim 2, further comprising, prior to the compressing of the surface of the carrier to one surface of the insulation body, removing a part of the first seed layer.

5. The method of claim 2, wherein the hole is formed in such a way that the hole penetrates through the first seed layer and the barrier.

6. The method of claim 1, wherein:
    the circuit pattern comprises a via land; and
    the hole is formed in such a way that the hole penetrates through a center of the via land.

7. The method of claim 1, wherein the forming of the conductive material is performed such that the inside of the via hole is filled.

* * * * *